United States Patent [19]
Ficchi, Jr. et al.

[11] Patent Number: 5,816,059
[45] Date of Patent: Oct. 6, 1998

[54] ARTIFICIAL INPUT CONTROLLER FOR HVAC SYSTEM

[76] Inventors: Vincent E. Ficchi, Jr.; James E. Freemire, both of 1015 Bleecker St., Utica, N.Y. 13501

[21] Appl. No.: 782,395

[22] Filed: Jan. 13, 1997

[51] Int. Cl.⁶ .................................................. F25B 49/02
[52] U.S. Cl. ............................................. 62/127; 236/94
[58] Field of Search ............................. 62/125, 126, 127, 62/129, 130, 131, 298, 299; 236/94; 165/11.1, 11.2

[56] References Cited

U.S. PATENT DOCUMENTS

| | | | |
|---|---|---|---|
| 3,736,765 | 6/1973 | O'Dell | 62/127 |
| 4,146,085 | 3/1979 | Wills | 62/127 X |
| 4,470,266 | 9/1984 | Briccetti et al. | 62/126 |
| 4,538,419 | 9/1985 | Lord | 62/129 |
| 4,798,055 | 1/1989 | Murray et al. | 62/127 |
| 5,113,665 | 5/1992 | Katsuki | 62/126 |
| 5,495,722 | 3/1996 | Manson et al. | 62/125 |

FOREIGN PATENT DOCUMENTS

| | | | |
|---|---|---|---|
| 4-36534 | 2/1992 | Japan | 62/125 |

*Primary Examiner*—Harry B. Tanner
*Attorney, Agent, or Firm*—Wall Marjama Bilinski & Burr

[57] ABSTRACT

An input controller for an HVAC unit includes switches and associated indicators to directly control various functions of an HVAC system. The input controller has seven switches, namely, heat 1, heat 2, cool 1, cool 2, power, fan, and auxiliary, with associated indicator lights. The input controller connects to a field control terminal strip on the HVAC unit via a ribbon cable terminating in separate wires with alligator clips.

9 Claims, 2 Drawing Sheets

ARTIFICIAL INPUT CONTROLLER FOR HVAC SYSTEM

BACKGROUND OF THE INVENTION

This invention relates to an artificial input controller for an HVAC system, and in particular, to a device which connects to conventional electro-mechanical control circuitry for an HVAC system and simulates various inputs normally received from a thermostat or other regulating device.

As the heating and air conditioning industry moves to microprocessor technology and so called "board driven" units, it becomes more difficult for servicemen to access and service equipment. This is true for both residential and industrial installations. In many instances, the controlling thermostat or regulating device is located away from the equipment being serviced. As part of troubleshooting or routine servicing procedures, the equipment is run through each of its various functions. In a residential unit, for example, a central air conditioning and heating system provides thermostatically controlled heating, cooling, and fan only functions. To test heating, for example, a servicer manually turns the thermostat to a temperature exceeding the ambient air temperature at the thermostat location. The servicer then proceeds to the heating unit to verify proper operation. The servicer returns to the thermostat to place the thermostat at its normal setting. A similar procedure is used to test the cooling system and fan only system. The problem is exacerbated in commercial systems. It is common to find a thermostat located several floors or buildings away from the heating and cooling unit. Productivity suffers since one person takes a long time to test a system, and using two persons becomes expensive.

An alternate method of testing involves using jumper cables at the control panel of the HVAC system. The servicer removes a panel cover, which usually has a safety interlock mechanism associated with the control panel, before attaching one end of a jumper cable to the power terminal in the control panel and the other end to the desired function terminal. The panel cover is then installed to activate the function. This procedure is repeated to test each function in the HVAC system. In order to test both stages of a two stage commercial HVAC systems, two jumper cables are used. For example, to test a two stage heating system, heat 1 and heat 2 must be activated simultaneously. One cable is connected between power and heat 1 while the other cable is connected between power and heat 2. Attaching two jumper cables to power can be quite difficult when only one power terminal exists. Other problems with jumper cables include accidentally blowing fuses as a live jumper cable makes inadvertent short circuits during the connection process.

This problem has been addressed in various ways. In U.S. Pat. No. 4,146,085, a diagnostic system is coupled between a logic module, which determines favorable conditions for operation, and both its associated thermostat and heat pump equipment. The diagnostic system is limited in that it is designed to work only with a heat pump system. In addition, it only interfaces the logic module, thereby limiting placement of the diagnostic system to the location of the logic module.

In U.S. Pat. No. 4,470,266, an apparatus regulates the delay periods in an air conditioning system using a specifically programmed microprocessor. The apparatus interfaces with the microprocessor and the use of the apparatus is therefore limited to the location of the microprocessor.

In U.S. Pat. No. 4,538,419, an apparatus is disclosed for checking the electronic controls of a refrigeration system instead of the electro-mechanical functioning of an HVAC system.

In U.S. Pat. No. 4,798,055, an apparatus includes a temperature probe which is placed at specific points in a refrigerant loop to analyze a refrigeration system.

In U.S. Pat. No. 5,113,665, a control device for an air conditioning unit includes means for operating a test run of the unit via microprocessor controls.

In U.S. Pat. No. 5,495,722, a remote control system is disclosed which allows a user to interface with an electronic control system via an infrared beam.

None of these inventions bypass the normal control system to permit direct electro-mechanical operation of the HVAC equipment.

OBJECTS AND SUMMARY OF THE INVENTION

Accordingly, an object of the present invention is to provide an artificial input controller that overcomes the drawbacks and limitations of the prior art.

Another object of the present invention is to provide an artificial input controller that eliminates the need for jumper cables when testing an HVAC system.

Another object of the present invention is to provide an artificial input controller that bypasses the thermostat.

Still another object of the present invention is to provide an artificial input controller that permits direct operation of the electro-mechanical portion of a HVAC system.

Briefly stated, an input controller for an HVAC unit includes switches and associated indicators to directly control various functions of an HVAC system. The input controller has seven switches, namely, heat 1, heat 2, cool 1, cool 2, power, fan, and auxiliary, with associated indicator lights. The input controller connects to a field control terminal strip on the HVAC unit via a ribbon cable terminating in separate wires with alligator clips.

According to an embodiment of the invention, an input controller for an HVAC system includes a housing, a plurality of switches mounted in the housing, a plurality of indicators mounted in the housing, each of the plurality of indicators being connected to a respective one of the plurality of switches, and wiring means for connecting each of the plurality of switches to a respective terminal on a field control terminal strip of the HVAC system, the plurality of switches being effective for activating a plurality of functions of the HVAC system.

According to an embodiment of the invention, an input controller for an HVAC system includes a housing, a power switch, a fan switch, a cool switch, and a heat switch installed in the housing, a power indicator, a fan indicator, a cool indicator, and a heat indicator installed in the housing and associated with a respective switch, wiring means for connecting the power switch, the fan switch, the cool switch, and the heat switch to a power terminal, a fan terminal, a cool terminal, and a heat terminal, respectively, on a field control terminal strip of the HVAC system, the power switch, when connected to the power terminal and turned ON, being effective for providing power to the input controller, the heat switch, when the power switch is connected to the power terminal and when the heat switch is connected to the heat terminal, and when the power switch and the heat switch are turned ON, being effective for activating a heating function of the HVAC system, the cool switch, when the power switch is connected to the power terminal and the cool switch is connected to the cool terminal, and when the power switch and the cool switch are turned ON, being effective for activating a cooling function of the HVAC system, and the fan switch, when the power switch is connected to the power terminal and the fan switch is connected to the fan terminal, and when the power switch and the fan switch are turned ON, being effective for activating a fan function of the HVAC system.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
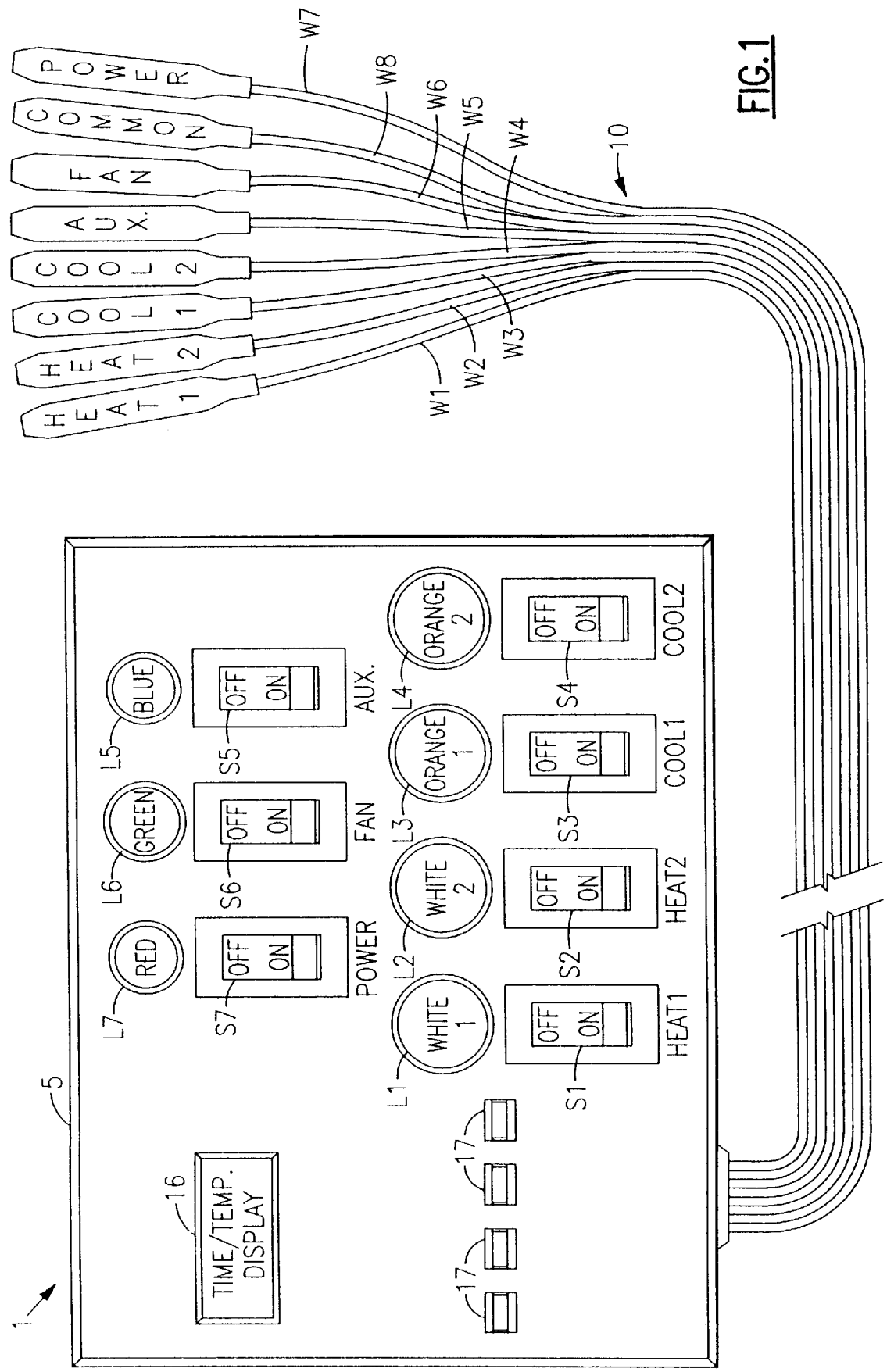
FIG. 1 is a perspective view of a first embodiment of the present invention.

Referring to FIG. 1, an artificial input controller 1 includes a housing 5 with a plurality of switches S1 through S7 mounted thereon. A plurality of respective indicators, such as lights L1 through L7 are associated with switches S1 through S7. Lights L1 through L7 are preferably 24 volt lamps, but can be LED's or mechanical indicators that indicate a presence of a current through the indicator. A set of wires, such as an eight-conductor ribbon cable 10, enters housing 1 through one side. Cable 10 includes conductors W1 through W7 electrically connected to switches S1 through S7, respectively, and a conductor W8 for a common ground. Conductors W1 through W8 are preferably terminated with alligator clips so that conductors W1 through W8 are easily attached to appropriate terminals on a field control terminal strip (not shown) of the HVAC system. For a permanent installation of the controller with the HVAC unit, terminal clips are preferably used instead of alligator clips.

A temperature and timing section 15, FIG. 1, includes a display panel 16 and a plurality of switches 17 for controlling time and temperature functions. Display panel 16 displays the various timing and temperature functions selected. Temperature and timing sections are commercially available and preferably include such functions as temperature, present time, a countdown timer, and a stopwatch. Temperature and timing section 15 is preferably battery powered by a battery 18 but is optionally powered off of the HVAC system being tested.

Housing 5 optionally has a magnetic strip affixed to its bottom so that controller 1 can easily be attached to a side panel of the HVAC unit.

Figure 2:
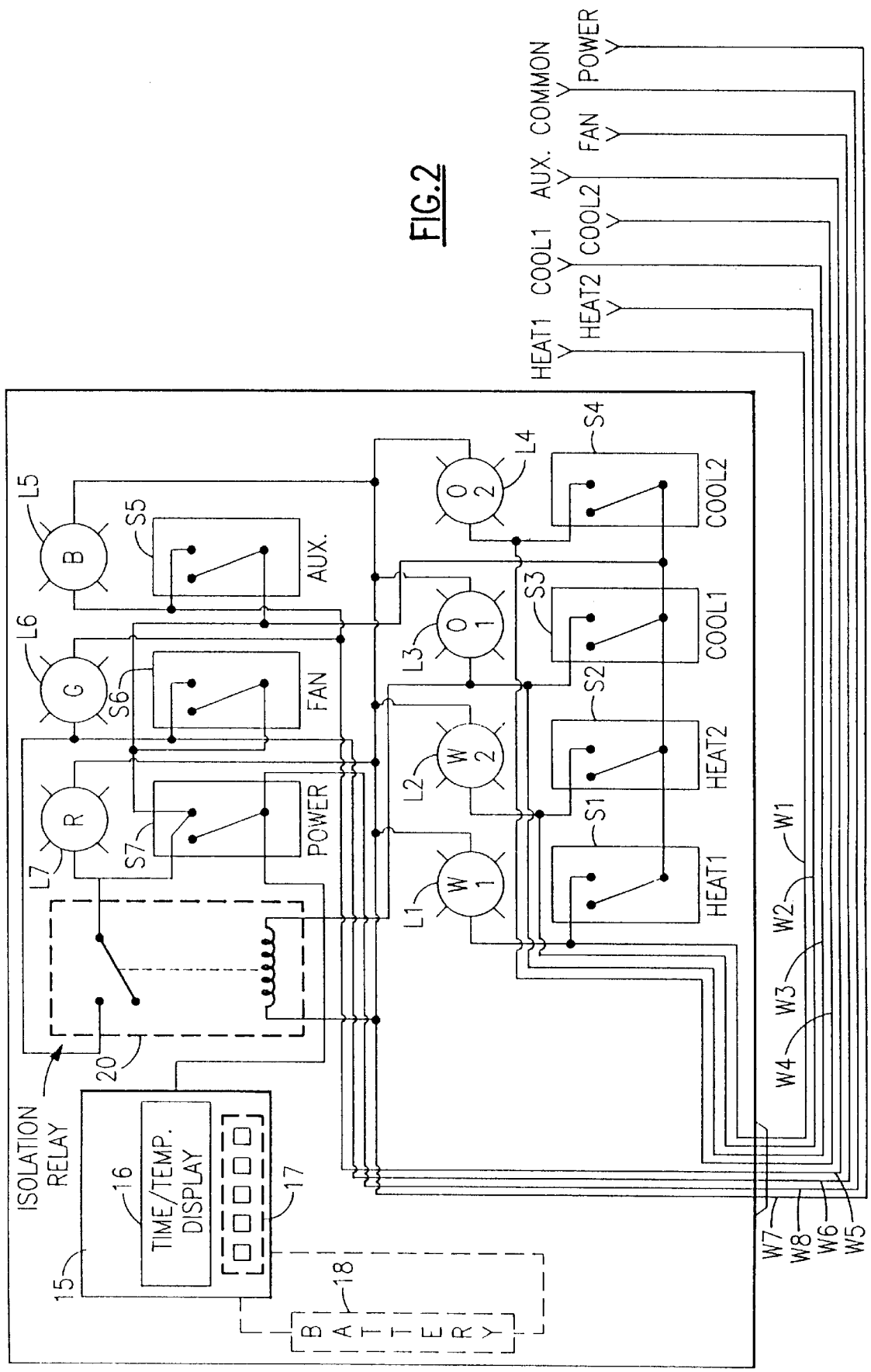
FIG. 2 is a schematic diagram of internal circuitry according to the first embodiment of the invention.

Referring to FIG. 2, each switch S1 through S7 is preferably a toggle switch shown here as a single pole single throw switch. Such a switch has two positions, OFF and ON. Switches S1 through S7 are designated heat 1, heat 2, cool 1, cool 2, auxiliary, fan, and power, respectively. First ends of switches S1 through S7 connect to respective conductors W1 through W7 and respective lights L1 through L7. Conductors W1 through W7 are for connecting to the heat 1, heat 2, cool 1, cool 2, auxiliary, fan, and power terminals, respectively, on the field control terminal strip (not shown) of the HVAC unit. Providing power to terminals heat 1, heat 2, cool 1, cool 2, auxiliary, fan activates corresponding functions within the HVAC unit. By "auxiliary function" is meant any additional function that may exist for a particular unit such as a reversing valve on a heat pump or a third stage of heating or cooling.

One end of conductor W8 is for connecting to a ground and another end connects to isolation relay 20. Ground conductor W8 is necessary for operation of isolation relay 20 and indicator lights L1 through L7 but is otherwise not required. Second ends of switches S1 through S6 are connected to a second end of switch S7 so that switches S1 through S6 make a connection when turned ON only when switch S7 (power) is turned ON. The second end of switch S3 (cool 1) is preferably connected to isolation relay 20 so that, when switch S3 (cool 1) is turned ON, assuming switch S7 (power) is ON, isolation relay 20 makes an independent connection across switch S6 (fan), thus energizing the fan function.

During testing of the HVAC unit, a servicer connects the conductors to their respective terminals on the field control terminal strip of the HVAC unit. The control panel cover with its safety interlock is easily reinserted around ribbon cable 10. Power switch S7 is turned ON and light L7 lights if power is present. When testing a new installation, fan switch S6 would next be turned ON to check that the fan relay in the HVAC unit works and that the phase is proper. If a problem is detected, turning fan switch S6 OFF is readily accomplished without the need for removing the control panel cover.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An input controller for use with a HVAC system, said HVAC system including a control unit having a field control terminal strip and at least one thermostat remotely disposed from said control unit, said input controller comprising:

a housing;

a plurality of switches mounted to said housing;

a plurality of indicators mounted to said housing, each of said plurality of indicators being connected to a respective one of said plurality of switches;

wiring means for connecting each of said plurality of switches to a respective terminal on said field control terminal strip of said HVAC system;

said plurality of switches being effective for selectively operating a plurality of functions of said HVAC system;

said input controller, when wired using said wiring means, being capable of operating said HVAC system without requiring separate access to said at least one remotely located thermostat.

2. An input controller according to claim 1, wherein:

said wiring means includes a wire cable having five conductors therein, one of said conductors for connecting to a ground; and said plurality of functions include a heating function, a cooling function, and a fan function.

3. An input controller according to claim 2, further comprising an isolation relay connected so that activating said cooling function activates said fan function.

4. An input controller according to claim 1, wherein:

said wiring means includes a wire cable having eight conductors, one of said conductors for connecting to a ground; and said plurality of functions include first and second heating functions, first and second cooling functions, a fan function, and an auxiliary function.

5. An input controller according to claim 4, further comprising an isolation relay connected so that activating said first cooling function activates said fan function.

6. An input controller according to claim 1, further comprising a display unit mounted in said housing, said unit including a plurality of switches on said housing for controlling a plurality of display functions relating to time and temperature.

7. An input controller for a HVAC system, said HVAC system including a control unit and at least one thermostat remotely located from said control unit, said input controller comprising;

a housing;

a power switch, a fan switch, a cooling switch, and a heating switch installed in said housing;

a power indicator, a fan indicator, a cool indicator, and a heat indicator installed in said housing, each indicator being associated with a corresponding one of said switches;

wiring means for connecting said power switch, said fan switch, said cooling switch, and said heating switch to a power terminal, a fan terminal, a cool terminal, and a heat terminal, respectively, each terminal being located on a field control terminal strip of said control unit of said HVAC system;

said power switch, when connected to said power terminal and turned ON, being effective for providing power to said input controller;

said heating switch, when said power switch is connected to said power terminal and when said heating switch is connected to said heat terminal, and when said power switch and said heating switch are turned ON, being effective for selectively activating a heating function of said HVAC system;

said cooling switch, when said power switch is connected to said power terminal and said cooling switch is connected to said cool terminal, and when said power switch and said cooling switch are turned ON, being effective for selectively activating a cooling function of said HVAC system; and said fan switch, when said power switch is connected to said power terminal and said fan switch is connected to said fan terminal, and when said power switch and said fan switch are turned ON, being effective for selectively activating a fan function of said HVAC system, wherein each of said functions are selectively operable by said input controller without requiring input from said at least one remotely located thermostat.

8. An input controller according to claim 7, further comprising an isolation relay connected so that when said power switch is connected to said power terminal, said cool switch is connected to said cool terminal, and said power switch is turned ON, turning said cool switch ON activates said cooling function and said fan function of said HVAC system.

9. An input controller according to claim 7, further comprising a time and temperature display unit mounted in said housing.

* * * * *